(12) United States Patent
Kasperkovitz (10) Patent No.: US 11,211,907 B2
(45) Date of Patent: Dec. 28, 2021

(54) THREE LEVEL PWM CLASS D AMPLIFIER

(71) Applicant: Semiconductor Ideas to the Market (ITOM) B.V., Eindhoven (NL)

(72) Inventor: Wolfdietrich Georg Kasperkovitz, Eindhoven (NL)

(73) Assignee: Semiconductor Ideas to the Market (ITOM) B.V., Eindhoven (NL)

( * ) Notice: Subject to any disclaimer, the term of this patent is extended or adjusted under 35 U.S.C. 154(b) by 0 days.

(21) Appl. No.: 16/888,695

(22) Filed: May 30, 2020

(65) Prior Publication Data

US 2020/0395900 A1 Dec. 17, 2020

(30) Foreign Application Priority Data

Jun. 1, 2019 (NL) .................................. N2023246

(51) Int. Cl.
*H03F 3/217* (2006.01)
*H03F 1/30* (2006.01)
*H03F 1/02* (2006.01)

(52) U.S. Cl.
CPC .......... *H03F 3/2173* (2013.01); *H03F 1/305* (2013.01); *H03F 2200/03* (2013.01); *H03F 2200/267* (2013.01); *H03F 2200/351* (2013.01)

(58) Field of Classification Search
CPC .... H03F 3/2173; H03F 1/305; H03F 2200/03; H03F 2200/267; H03F 2200/351; H03F 2200/271; H03F 2200/48; H03F 3/185; H03F 1/0205; H03K 7/08
USPC ........................................ 330/251, 207 A, 10
See application file for complete search history.

(56) References Cited

U.S. PATENT DOCUMENTS 8,049,561 B2\* 11/2011 Buter .................... H03F 3/2173
330/251
8,362,832 B2\* 1/2013 Kim ...................... H03F 3/2173
330/10
9,628,040 B2\* 4/2017 Lesso .................... H03G 7/007

\* cited by examiner

*Primary Examiner* — Hieu P Nguyen
(74) *Attorney, Agent, or Firm* — Robert M. McDermott (57) ABSTRACT

A Class D amplifier comprising a control circuit configured to receive an audio input signal and derive first, second and third PWM switching control signals therefrom, being supplied to respectively first, second and third switches of a driver, the first and second switches being serially arranged between first and second supply voltages, and having a common node coupled to an output terminal. The driver comprises a DC level shifter being configured to provide a reference voltage to a reference terminal in at least first and second states of operation, said reference voltage including a DC component at least substantially equidistant between the first and second supply voltages. Said third switch being included in a shunt path between the output and the reference terminal.

2 Claims, 4 Drawing Sheets

THREE LEVEL PWM CLASS D AMPLIFIER

This application claims the benefit of Dutch Patent Application N2023246, filed 1 Jun. 2019.

BACKGROUND AND SUMMARY OF THE INVENTION

The invention relates to three level pulse width ("PWM") single ended ("SE") Class-D amplifiers with improved power saving techniques and more specifically to a technique reducing parasitically accumulated energy, which otherwise would generate e.g. excess heat, annoying signal distortions and/or EMI noise.

Such three level PWM SE amplifiers may be used to receive and amplify input analog signals having frequency components in the audio frequency range or frequency components in other frequency ranges, which can be lower than, overlapping or higher than the audio frequency range, which dependent on the transistor switching speed, may extend to frequency ranges within the RF transmission spectrum.

Three level prior art PWM SE amplifiers using a positive, a negative and a ground reference voltage to provide a three level output signal to a speaker are known from e.g. U.S. Pat. Nos. 8,466,743 and 8,362,832, however without disclosing how the ground reference voltage is being obtained.

A prior art SE audio amplifier using a reference capacitor as DC levelshifter to provide a ground reference voltage is on itself known e.g. from U.S. Pat. No. 9,515,617.

Figure 1:
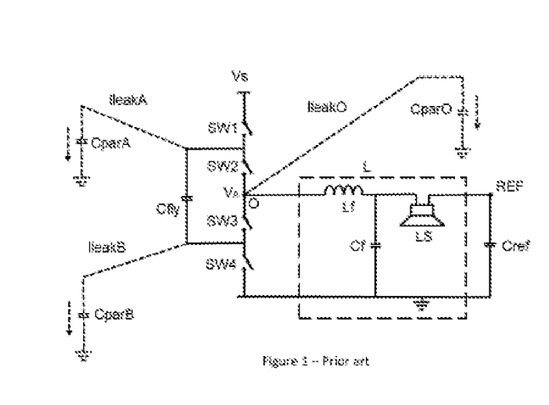
FIG. 1 is a schematic diagram of the prior art three level SE Class-D amplifier of U.S. Pat. No. 9,515,617.

This known SE amplifier is schematically shown in FIG. 1 and comprises a half bridge driver D with respective first to fourth switches, SW1 to SW4, being serially arranged between first and second supply voltages, Vs and a zero ground voltage GND. The common node of the second and third switches SW2 and SW3, is coupled to an output terminal O. A flying capacitor Cfly is included in a shunt path across the second and third switches SW2 and SW3. In practice, the flying capacitor Cfly is an external printed circuit board ("PCB") component and connected to the remaining part of the driver D via PCB external nodes A and B. In this context, internal PCB nodes are understood to interconnect only components embedded within the circuitry printed on the PCB, whereas PCB external nodes are understood to connect at least one of such embedded components to at least one component located beyond said PCB.

Figure 8A:
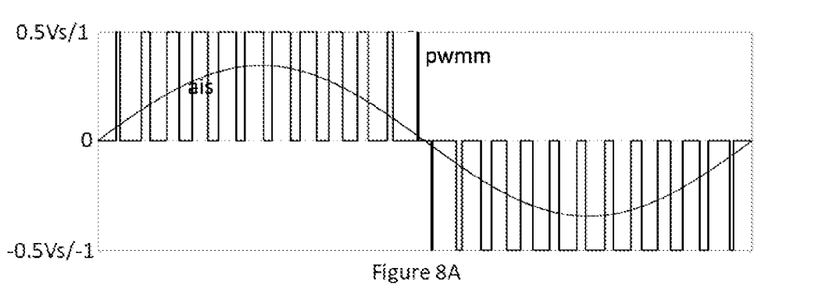
FIG. 8A is a plot illustrating the PWM output signal waveform pwmm of the cited prior art amplifier as well as the first to third embodiments of a SE Class-D amplifier according to the invention.

The driver D comprises a DC voltage source (not shown) providing a predetermined DC voltage difference across the flying capacitor Cfly, set substantially to one half of a DC voltage difference between the first and second DC supply voltages, i.e. at 0.5Vs, and defining the DC level of the three level PWM signal between the output terminal O, to obtain a three level PWM signal between the output terminal O and a reference terminal REF, as shown by curve pwmm in FIG. 8A. Apart therefrom, the driver D also includes a DC level shifter being constituted by a reference capacitor Cref coupled between ground and said reference terminal REF, averaging the amplitude variations of the voltage signals received from the output terminal O into a DC reference level Vref being provided at said reference terminal REFequal to the DC level of the three level PWM signal at the output terminal O.

A load L is connectable between the output terminal O and the reference terminal REF and may include a single loudspeaker LS, or dependent on minimum THD requirements, an audio filter AF together with a loudspeaker LS as shown. An example of said three level PWM output signal OS after being filtered is illustrated by curve fos in FIG. 8B. In practice, the connections of the PCB external load L between the output terminal O and the reference voltage terminal REF are inevitably implemented via PCB external nodes.

The above cited reference, however, neither deals with nor even identifies the sources of power loss and EMI noise, which are inherent to this known SE type three level Class-D amplifiers.

More specifically, the cited reference ignores the dramatic decrease in power efficiency and EMI noise suppression caused by respective leakage currents IleakA, IleakB and IleakO, charging at each positive edge of a voltage transition, the parasitic capacitances (CparA, CparB and CparO) at PCB external nodes A, B and O, respectively, i.e. at both ends (A and B) of the flying capacitor Cfly, and at the output terminal O, as shown in FIG. 1 in dotted lines. Parasitic capacitances also occur at the reference terminal REF, however the effect thereof can be neglected, as the reference voltage Vref supplied to this reference terminal REF, is a DC voltage.

The above leakage currents IleakA, IleakB and IleakO amount approximately to:

IleakA=CparA*fclock*0.5Vs;
IleakB=CparB*fclock*0.5Vs and
IleakO=CparO*fclock*0.5Vs.

In these formulae, fclock is the clock frequency of the PWM output signal and 0.5Vs, the amplitude of the voltage transitions. Assuming that the parasitic capacitances CparA, CparB and CparO are mutually equal, the total leakage current Ileak amounts to approximately CparO*fclock*0.5Vs*3.

Furthermore, the voltage transitions at said PCB external nodes A, B and O also generate EMI noise.

The above prior art SE type of three level PWM Class D amplifier is therefore limited in power efficiency as well as EMI noise suppression.

It is a first object of the invention to improve the performance of three level PWM Class D amplifiers on EMI reduction and power efficiency, in particular at typical small or close to zero audio signals for use in a wide frequency range, including the audio frequency range or other frequency ranges, such as frequency ranges within the RF transmission spectrum.

It is a second object of the invention to offer a robust and simple three level PWM Class D amplifier architecture without giving in on performance.

It is a third object of the invention to optimize the price/performance ratio of such three level PWM Class D amplifiers.

Now, therefore, a three level Class D amplifier comprising a control circuit configured to receive an analog input signal and derive therefrom first, second and third PWM switching control signals being supplied to respectively first, second and third switches of a driver to obtain a three level PWM single ended output signal between an output terminal and a reference terminal, the first and second switches being serially arranged between first and second supply voltages, and having a common node coupled to the output terminal, the driver comprising a DC level shifter being configured to provide a DC reference voltage at least substantially equidistant between the first and second supply voltages, according to the invention is characterized by said third switch being included in a shunt path between the output terminal and the reference terminal, a first level of said three level PWM output signal being obtained in said first state of operation in which the first switch is closed and the second and third switches are open, a second level thereof being obtained in said second state of operation in which said second switch is closed and said first and third switches are open, and an intermediate level thereof at least substantially equal to the reference voltage is being obtained in a third state of operation in which said third switch is closed, whereas said first and second switches are open.

The invention derives from an analog input signal a three level SE PWM output signal as shown in FIG. 8A, which in itself corresponds to the output signal of the SE type three level PWM Class D amplifier of cited U.S. Pat. No. 9,515,617.

However, said known type SE three level Class D amplifier is using four switches, each with its switching losses, a flying capacitor Cfly and three PCB external, power leaking and EMI radiating nodes A, B and T1.

In contrast therewith, the invention refrains from the use of such flying capacitor Cfly and reduces the number of switches needed to only three and the number of PCB external power leaking and EMI radiating nodes to only one, i.e. the one at the output terminal O.

This results not only in a significant increase in power efficiency and EMI noise reduction, it also reduces the complexity of the circuitry and the cost price due to the use of fewer components and less board space.

The invention therewith provides a power efficient, low EMI, robust and low cost amplification solution in particular suitable in the field of battery operated consumer audio products.

A preferred embodiment of SE type Class D amplifiers according to the invention using one of the first and second supply voltages as a common ground, is characterized in that said DC level shifter includes a reference capacitor being coupled between said common ground and the reference terminal to integrate the signal voltage variations received from the output terminal in said first and second states of operation into a DC reference voltage at a level, at least substantially equidistant between the first and second supply voltages.

An alternative embodiment of SE type Class D amplifiers according to the invention using one of the first and second supply voltages as a common ground, is preferably characterized in that said level shifter includes a reference capacitor coupled between the common node of the first and second switches and the output terminal to integrate signal voltage variations received from said common node in said first and second states of operation into said DC reference voltage and said common ground is coupled to the reference terminal.

Another embodiment of SE type Class D amplifiers according to the invention is characterized in that said first and second supply voltages are being coupled to the DC level shifter providing a differential supply voltage across the serial arrangement of first and second switches, symmetrically balanced around a common ground providing a DC reference voltage at a level, at least substantially equidistant between the first and second supply voltages, which common ground is connected to the reference terminal.

The above and other object features and advantages of the present invention will be discussed in more detail hereinafter with reference to the disclosure of preferred embodiments, in which like or similar components are designated by the same numeral through the several views and in particular with reference to the appended Figures.

Well known circuits have been shown therein in functional schematic diagram form in order not to obscure the present invention in unnecessary detail. For the most part, details concerning timing and processing considerations and the like, such as dead times, have been omitted inasmuch as such details are not necessary to obtain a complete understanding of the present invention and are within the skill of persons of ordinary skill in the relevant art.

BRIEF DESCRIPTION OF THE DRAWINGS

The invention is explained in further detail, and by way of example, with reference to the accompanying drawings wherein:

FIGS. 5A, 5B and 5C are schematic diagrams showing the state of the first to third switches S1, S2 and S3 and the various currents in the respective first, second and third states of operation of the first SE embodiment of the Class-D amplifier of FIG. 2.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

FIG. 1 illustrates the prior art SE three level half bridge Class-D amplifier of U.S. Pat. No. 9,515,617 providing a three level PWM output signal OS, which on itself is similar to the one shown in FIG. 8A. As already described in more detail in the above introductory of the description, inherent to this prior art SE amplifier are the multiple sources of power loss, due to the use of a PCB external floating capacitor Cfly and the need for extra switches to operate it.

Figure 2:
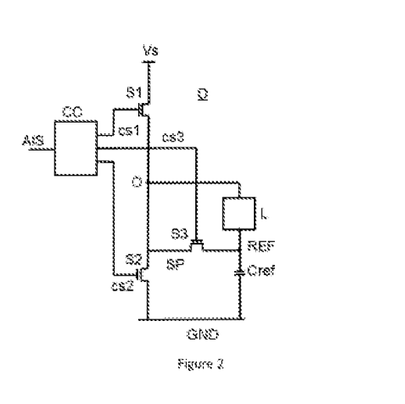
FIG. 2 is a schematic diagram of a first embodiment of a three level SE Class-D amplifier according to the invention.

FIG. 2 shows a first embodiment of a three level PWM SE Class D amplifier according to the invention comprising a control circuit CC receiving an analog input signal AIS and deriving therefrom respective first, second and third level PWM switching control signals, cs1, cs2 and cs3. The control circuit CC will be described in more detail with reference to FIG. 9.

These first, second and third PWM switching control signals, cs1, cs2 and cs3, are coupled to control inputs of first, second and third switches, S1, S2 and S3, respectively, of a driver D.

The driver D comprises a type half H bridge circuit having a serial arrangement of said first and second switches S1 and S2, respectively, coupled between a positive first supply voltage +Vs and a second supply voltage functioning as common ground, zero voltage level GND. The common node between the first and second switches S1 and S2, is coupled to an output terminal O. A DC level shifter including a ground connected reference capacitor Cref, hereafter also being referred to as DC level shifter Cref, provides a DC reference voltage Vref to the reference terminal REF. According to the invention, said third switch S3 is included in a shunt path SP between the output terminal O and the reference terminal REF.

In operation, an amplifier external load L is coupled to the driver D between the output terminal O and the reference terminal REF.

The first, second and third switches, S1, S2 and S3 are being controlled by said first, second and third PWM switching control signals, cs1, cs2 and cs3 to provide a modulation scheme generating a three level SE PWM output signal between the output terminal O and the reference terminal REF. According to the invention, a first level of said three level PWM output signal is being obtained in the first state of operation in which the first switch S1 is closed and the second and third switches S2 and S3 are open, a second level thereof is being obtained in the second state of operation, in which said second switch S2 is closed and said first and third switches S1 and S3, are open, and an intermediate level thereof at least substantially equidistant between the first and second level is being obtained in a third state of operation in which said third switch S3 is closed, whereas said first and second switches S1 and S2, respectively are open. These first to third states of operation will be explained in greater detail with reference to FIGS. 5A to 5C.

The DC level shifter Cref is dimensioned such that within the timing of the modulation scheme, the voltage variations arriving across DC level shifter Cref from the output terminal O are being averaged into said DC reference voltage Vref, at least substantially equidistant between the first and second supply voltages, V1 and V2., i.e. at 0.5Vs. In generating said DC reference voltage Vref, the DC level shifter Cref of FIG. 2 corresponds to the DC level shifter constituted by reference capacitor Cref of the prior art three level PMW SE audio amplifier of FIG. 1 and no further amplification is needed for a proper understanding of the invention.

Figure 10:
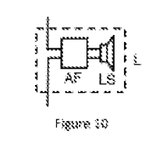
FIG. 10 is a schematic diagram of a load of the first to third embodiments of SE Class-D amplifiers according to the invention functioning as audio amplifier.
Figure 11:
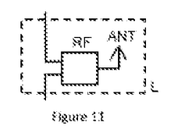
FIG. 11 is a schematic diagram of a load of the first to third embodiments of SE Class-D audio amplifiers according to the invention functioning as RF antenna amplifier.

The switches S1, S2 and S3 may be implemented in CMOS or any other semiconductor technology and are being controlled by respective switching control signals cs1, cs2 and cs3 to switch on, close or bring it into a conductive state, e.g. at a binary value cs=1 and switch off, open or bring it into a non-conductive state at a binary value cs=0. Dependent on the switching speed of the switches S1 to S3, the amplifier may be dimensioned to function as an audio amplifier, such as referred to in the above cited U.S. Pat. No. 9,515,617, in which case the analog input signal is an audio signal and the load L includes an audio filter AF followed by a loudspeaker LS as shown in FIG. 10, or by a single audio loudspeaker LS (not shown) such as referred to in the above cited U.S. Pat. No. 6,211,728. At a sufficiently high switching speed the amplifier may be dimensioned to function as an RF transmitter amplifier, in which case the analog input signal is an RF transmitting signal and the load L includes an RF filter RF followed by an RF antenna ANT as shown in FIG. 11.

Figure 9:
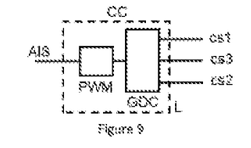
FIG. 9 is a schematic diagram of a control circuit generating control signals for the switches of the driver D of the three level PWM SE amplifier of the first to third embodiments of SE Class-D amplifiers according to the invention.

A functional block diagram of the control circuit CC is shown in FIG. 9 and includes a three level PWM modulator M followed by a gate driver circuit GDC. An analog input signal AIS is being provided to the modulator M and modulated therein into a three level PWM modulated signal PWMM. FIG. 8A illustrates by way of example said analog input signal AIS and the three level PWM modulated signal generated therefrom by the modulator M with curves ais and pwmm, respectively, both in a unitary scaling. First, second and third signal levels at respective amplitudes +1, −1 and 0 of this three level PWM modulated signal pwmm are being obtained in respective first, second and third states of operation of the modulator M.

Such modulator M is itself known, e.g. from https://www.mathworks.com/help/physmod/sps/powersys/ref/pwmgenerator3level.html.

At the reception of these first, second and third levels, the gate driver circuit GDC generates the respective appropriate sets of binary values of the first to third switching control signals cs1, cs2 and cs3, necessary for the driver D to correspond to the modulator M in state of operation. In the above example of binary values for the switching control signals cs1, cs2 and cs3, this will be obtained with gate driver circuit GDC generating binary values (1,0,0), (0,1,0) and (0,0,1) for the first to third switching control signals (cs1,cs2,cs3) when receiving the respective first, second and third level of the three level PWM modulated signal from the modulator M.

Figure 8B:
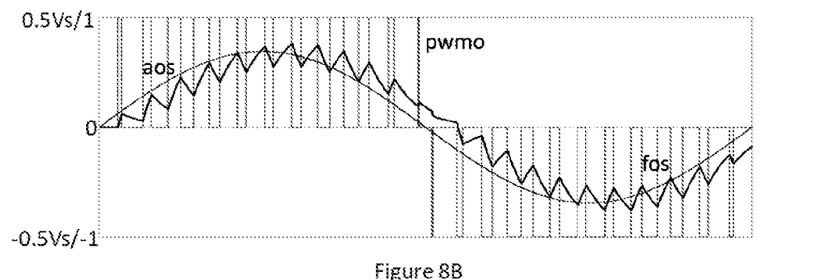
FIG. 8B is a plot illustrating the PWM output signal of FIG. 8A after being filtered into an analog output signal fos.

This results in an amplification of the three level PWM signal of the modulator M pwmm in the driver D into the above three level differential PWM output signal between the output terminal O and the reference terminal REF as illustrated in FIG. 8B with curve pwmo. First, second and third signal levels at respective amplitudes 0.5Vs, −0.5Vs and 0 of this three level PWM modulated signal pwmo are being obtained in respective first, second and third states of operation of the driver D.

In the audiofilter AF of FIG. 10, or as the case may be in the RF filter RF of FIG. 11 of the load L, the three level differential PWM output signal pwmo is being filtered to obtain a filtered output signal fos, which includes a signal component aos, representing an amplified version of the analog input signal ais.

Given the above functionalities of the various switches of the driver D in the first, second and third states of operation necessary to obtain the above amplification according to the invention, the translating thereof to an actual realization of the control circuit CC is straightforward to a person skilled in the art and is not limited to the example described with reference to FIG. 9.

Figure 5A:
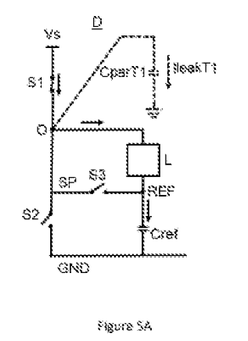

FIG. 5A is a functional diagram illustrating the driver D of the above first embodiment of a three level PWM SE Class D amplifier according to the invention being connected to an external load L, which does not form part of the amplifier, in its first state of operation, in which the first switch S1 is closed and the second and third switches, S2 and S3, respectively, are open. This means that the voltage level at the output terminal O is equal to the supply voltage Vs.

The flow of the supply current in this first state of operation is indicated with solid arrows.

Starting from the supply voltage Vs the current subsequently passes the closed first switch S1, and the output terminal O, after which the supply current is split into on the one hand a wanted load current and on the other hand an unwanted leakage current LleakT1 charging the parasitic capacitance CparT1 occurring at the output terminal O. The leakage current LleakT1 will be discussed in greater detail with reference to FIG. 8A.

The wanted load current is being supplied through the output terminal O to the load L and subsequently integrated in the DC level shifter Cref, into a reference voltage Vref defined by the voltage across the DC level shifter Cref of 0.5Vs, appearing at the reference terminal REF. The so obtained first level of the three level PWM SE output signal between the output terminal O and the reference terminal REF in this first state of operation therewith corresponds to 0.5Vs.

Figure 5B:
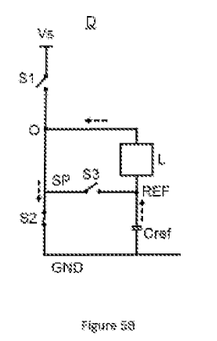

FIG. 5B is a functional diagram illustrating the driver D of the first embodiment of a three level PWM SE Class D amplifier according to the invention in its second state of operation, in which the second switch S2 is closed and said first and third switches S1 and S3, respectively, are open, resulting at the output terminal O in a second level of said three level PWM signal corresponding to zero voltage level GND.

The flow of the load current in this second state of operation is indicated with dotted arrows.

Unlike the load current in the first state of operation, the load current in the second state of operation is being supplied from the DC level shifter Cref. Starting from the DC level shifter Cref the load current passes the load L, the output terminal O and the second switch S2, whereupon it sinks to the common zero voltage level GND. Due to the voltage across the DC level shifter Cref, the second level of the three level PWM SE output signal between the output terminal O and the reference terminal REF therewith corresponds to −0.5Vs.

In this second state of operation the load current does not charge the power supply provided by the first supply voltages, Vs and GND, respectively.

FIG. 5C is a functional diagram illustrating the driver D of the first embodiment of a three level PWM SE Class D amplifier according to the invention in its third state of operation, in which the first and second switches, S1 and S2 are open and the third switch S3 is closed. The output terminal O is on the one hand disconnected from both first and second supply voltages Vs and GND, respectively, and on the other hand via the third switch S3 connected to the reference terminal REF. This results into a third level of the three level PWM SE output signal between the output terminal O and the reference terminal REF in this third state of operation corresponding to 0, i.e. corresponding to an intermediate DC level substantially equidistant between the first and second level of said three level PWM output signal.

Also in this third state of operation no current is being supplied to the load L from the power supply, provided by the first and second supply voltages, Vs and GND, respectively.

As can be derived from FIG. 8A, during positive halves of the audio input signal AIS the driver D toggles between the first and third state of operation and vice versa in order for the three level pulse width modulation signal between the output terminal O and the reference terminal REF to switch between the first level and the intermediate level and vice versa.

This first state of operation occurs once per clock period only during the positive halves of the three level pulse width modulated output signal. Compared to the prior art amplifier of FIG. 1, this reduces the average occurrence of leakage current IleakO charging the parasitic capacitances at the output terminal O, to fclock/2. The leakage current IleakO depends on the parasitic capacitance CparO and the voltage level difference between the high and intermediate level, i.e. 0.5Vs, resulting in $$IleakO=CparO*0.5fclock*0.5Vs.$$

During negative halves of the audio input signal AIS the driver D toggles between the second and third state of operation and vice versa in order for the three level PWM signal between the output terminal O and the reference terminal REF to switch between the second level and the intermediate level and vice versa. As both second and third states of operation require no power from the supply voltages, said three level PWM output signal is being generated during the negative halves of the audio input signal without any power being supplied to the driver D from the voltage supply.

This means that compared to the total leakage current Ileak=CparO*fclock*0.5Vs*3 of the cited single-ended output driver of U.S. Pat. No. 9,515,617, the invention increases power efficiency with approximately a factor 5.

Furthermore, in removing the use of a flying capacitor, the invention limits the sources of EMI noise to merely the inevitable one occurring at the output terminal O, therewith providing an increase in EMI reduction with approximately a factor 3.

Unlike the three level PWM SE Class D amplifiers of cited U.S. Pat. No. 9,515,617 the intermediate level of the three level PWM output signal between the output terminal O and the reference terminal REF is obtained by disconnecting the output terminal O from both first and second supply voltages and simultaneously interconnecting both output and reference terminals by closing the third switch S3. As a consequence, the voltage difference between these terminals reduce to zero.

Figure 3:
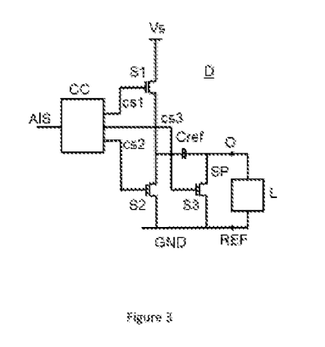
FIG. 3 is a schematic diagram of a second embodiment of a three level SE Class-D amplifier according to the invention allowing to couple a load to the driver using common ground with a single wire connection between the output O of the driver and the load.

FIG. 3 illustrates a second embodiment of a three level PWM SE Class-D switching amplifier according to the invention which differs from the first embodiment of FIG. 2 mainly in that the DC level shifter Cref is coupled between the common node of the first and second switches S1 and S2 and the output terminal O. The DC level shifter Cref integrates supply currents received from said common node in said first and second states of operation into a DC reference voltage similar to the DC reference voltage Vref of the first embodiment. However here, the DC reference voltage Vref is being supplied to the output terminal O, whereas the reference terminal REF is coupled to ground GND. This allows coupling of the external load L through the reference terminal REF to the same ground GND as the amplifier, requiring only a single wire to connect the output terminal O to a signal input of said external load L.

Figure 6A:
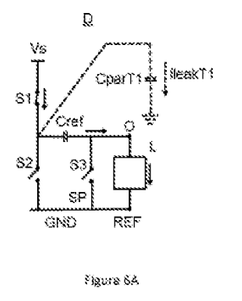
FIGS. 6A, 6B and 6C are schematic diagrams showing the state of the first to third switches S1, S2 and S3 and the various currents in the respective first, second and third states of operation of the second embodiment of the SE Class-D amplifier of FIG. 3.

FIG. 6A is a functional diagram illustrating the driver D of the second embodiment of a three level PWM SE Class D amplifier according to the invention in its first state of operation, in which the first switch S1 is closed and the second and third switches, S2 and S3, respectively, are open.

The flow of the supply current in this first state of operation is indicated with solid arrows.

Starting from the supply voltage Vs, the supply current subsequently passes the closed first switch S1, after which at the common node of the first and second switches S1 and S2, the supply current is split into on the one hand an unwanted leakage current LleakT1 charging the parasitic capacitance CparT1 occurring at said common node. On the other hand the supply current provides a wanted load current, charging DC level shifter Cref to a DC voltage of 0.5Vs, resulting in a DC voltage defining the first level of the three level PWM SE output signal between the output terminal O and the reference terminal REF of Vs −0.5Vs=0.5Vs. The leakage current LleakT1 will be discussed in greater detail with reference to FIG. 8A.

Figure 6B:
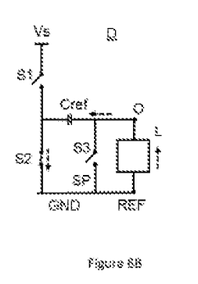

FIG. 6B is a functional diagram illustrating the driver D of the second embodiment of a three level PWM SE Class D amplifier according to the invention in its second state of operation, in which the second switch S2 is closed and said first and third switches S1 and S3, respectively, are open.

The flow of the load current in this second state of operation is indicated with dotted arrows.

Unlike the load current in the first state of operation, the load current in the second state of operation is being supplied from the DC level shifter Cref. Starting from the reference capacitor Cref the load current passes the load L, the output terminal O and the second switch S2, whereupon it sinks to the common zero voltage level GND. This results in a DC voltage defining the second level of the three level PWM SE output signal between the output terminal O and the reference terminal REF of −0.5Vs.

In this second state of operation the load current does not charge the power supply provided by the first supply voltages, Vs and GND, respectively.

Figure 6C:
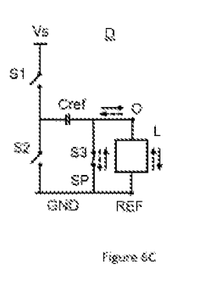

FIG. 6C is a functional diagram illustrating the driver D of the second embodiment of a three level PWM SE Class D amplifier according to the invention in its third state of operation, in which the first and second switches, 51 and S2 are open and the third switch S3 is closed. The output terminal O is on the one hand disconnected from both first and second supply voltages Vs and GND, respectively, and on the other hand via the third switch S3 connected to the reference terminal REF. This results in a DC voltage defining the third level of the three level PWM SE output signal between the output terminal O and the reference terminal REF of 0, i.e. equidistant between said first and second levels and corresponding to the intermediate level of said three level PWM output signal.

Also in this third state of operation no current is being supplied to the load L from the power supply, provided by the first and second supply voltages, Vs and GND, respectively.

As can be derived from FIG. 8B, during positive halves of the audio input signal AIS the driver D toggles between the first and third state of operation and vice versa in order for the three level pulse width modulation signal between the output terminal O and the reference terminal REF to switch between the first level and the intermediate level and vice versa.

The first state of operation occurs once per clock period only during the positive halves of the three level pulse width modulated output signal. Compared to the prior art amplifier of FIG. 1, this reduces the average occurrence of leakage current IleakO charging the parasitic capacitances at the output terminal O, to fclock/2. The leakage current IleakO depends on the parasitic capacitance CparO and the voltage level difference between the high and intermediate level, i.e. 0.5Vs, resulting in IleakO=CparO*0.5fclock*0.5Vs.

During negative halves of the audio input signal AS the driver D toggles between the second and third state of operation and vice versa in order for the three level PWM signal at the output terminal O to switch between the second level and the intermediate level and vice versa. As both second and third states of operation require no power from the supply voltages, said three level PWM output signal at the output terminal O is being generated during the negative halves of the audio input signal without any power being supplied to the driver D from the voltage supply.

Figure 4:
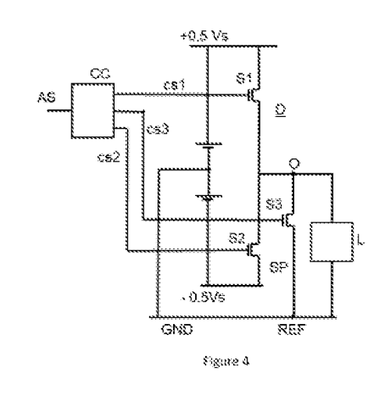
FIG. 4 is a schematic diagram of a third embodiment of a three level SE Class-D amplifier according to the invention using a differential supply voltage, providing a first supply voltage at +0.5Vs and a second supply voltage at −0.5Vs around a zero level common ground GND, allowing to couple a load to the driver using said common ground with a single wire connection between the output O of the driver and the load.

FIG. 4 illustrates a third embodiment of a three level PWM SE Class-D switching amplifier according to the invention using of a differential pair of first and second supply voltages at first and second voltage levels of e.g. +0.5Vs and −0.5Vs, respectively, providing the function of the DC level shifter Cref as used in the above first and second preferred embodiments of the invention of FIGS. 2 and 3, by taking the supply voltage at common node between said first and second supply voltages as common ground GND. For that purpose, said common node is connected to the reference terminal REF, providing a DC reference voltage Vref=0, which is equidistant between the first and second voltage levels +0.5Vs and 0.5Vs. As a result thereof both the driver D and the load L share ground GND in common removing the necessity for the use of a reference capacitor Cref as DC level shifter and requiring only a single wire between the output terminal O and the external load L to operatively connect the load L to the driver D.

The third switch S3 is included in a shunt path SP between the output terminal O and ground GND, which in operation constitutes a controllable shunt path SP across to the external load L.

The modulation scheme used in this third embodiment of the SE Class-D switching amplifier according to the invention of FIG. 4 is similar to the one of the first embodiment of FIG. 2A and is also based on first to third states of operation of the driver D, in which the states of switches S1, S2 and S3 are the same as those in the corresponding first to third states of operation of the first embodiment of FIG. 2A.

Figure 7A:
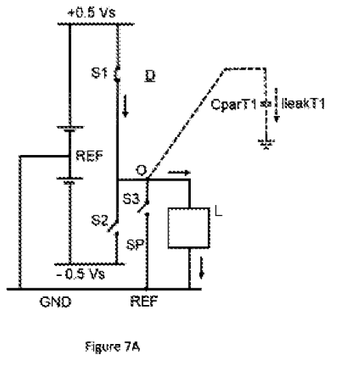
FIGS. 7A, 7B and 7C are schematic diagrams showing the state of the first to third switches S1, S2 and S3 and the various currents in the respective first, second and third states of operation of the third embodiment of the SE Class-D amplifier of FIG. 4.

FIG. 7A illustrates the first state of operation of the driver D of the amplifier of FIG. 4, in which the first switch S1 is closed and the second and third switches, S2 and S3, respectively, are open, resulting in the three level PWM output signal between the output terminal O and the reference terminal REF obtaining a first level.

The flow of the load current in this first state of operation is indicated with solid arrows.

The parasitic capacitances CparT1 occurring at the output terminal O—shown in dotted lines—are charged by leakage current LleakT1 at each positive edge of the three level PWM output signal. By the same reasoning as above with reference to FIG. 5A also here, $$IleakT1 = CparT1 * 0.5 fclock * 0.5 Vs.$$

Figure 7B:
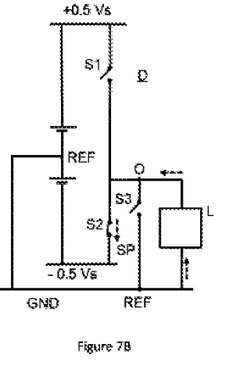

FIG. 7B illustrates the second state of operation of the driver D, in which the second switch S2 is closed and said first and third switches S1 and S3, respectively, are open.

The flow of the load current in this second state of operation is opposite to that in the first state of operation, and indicated with dotted arrows.

Unlike the load current in the first state of operation, the load current in the second state of operation is being supplied from the zero voltage level GND to the load L after which it passes the third switch S3 on its way to the second supply voltage −0.5Vs, resulting in a second level of the three level PWM output signal between the output terminal O and the reference terminal REF at −0.5Vs.

Figure 7C:
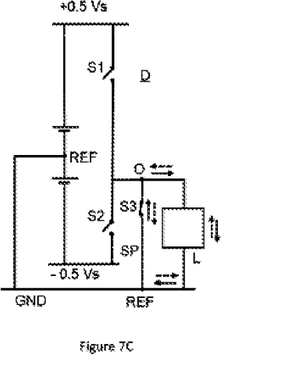

FIG. 7C illustrates the third state of operation of the driver D, in which the first and second switches, S1 and S2 are open and the third switch S3 is closed. The output terminal O is on the one hand disconnected from both first and second supply voltages 0.5Vs and −0.5Vs, respectively, and on the other hand via the closed third shunting switch S3 connected to the common ground voltage GND, defining the third level of said three level PWM output signal between the output terminal O and the reference terminal REF at an intermediate level corresponding to the ground voltage GND, i.e. substantially equidistant between said first and second levels.

Also for this third embodiment of a SE Class-D switching amplifier according to the invention, FIG. 8A illustrates that during positive halves of the audio input signal ais the driver D toggles between the first and third state of operation and vice versa in order for the three level PWM output signal between the output terminal O and the reference terminal REF to switch between the first level and the intermediate level and vice versa.

Similar to the first embodiment of a SE Class-D switching amplifier of FIG. 3, the first state of operation occurs once per clock period only during the positive halves of the three level PWM output signal, reducing the average occurrence of leakage current IleakT1 charging the parasitic capacitances CparT1 at the output terminal O to fclock/2. As the leakage current IleakT1 depends on the parasitic capacitance CparT1 and the voltage level difference between the first and intermediate level of 0.5Vs:

$$IleakT1 = CparT1 * 0.5 fclock * 0.5 Vs.$$

During negative halves of the audio input signal AIS the driver D toggles between the second and third state of operation and vice versa in order for the three level PWM output signal at the output terminal O to switch between the second and the intermediate level and vice versa. As both second and third states of operation require no power from the voltage supply, the driver D doesn't charge the power supply provided by the first and second supply voltages 0.5Vs and −0.5Vs when generating said three level PWM output signal, during the negative halves of the audio input signal AIS.

The reasoning given above with respect to the power efficiency and EMI reduction of the first embodiment of the invention of FIG. 2A, applies to this third embodiment of the invention of FIG. 4 as well, in the sense that compared to the prior art amplifier of U.S. Pat. No. 9,515,617, also here an increase in power efficiency with approximately a factor 5 is being obtained, and an increase in EMI reduction with approximately a factor 3.

The invention is not limited to the embodiments explicitly disclosed. The person skilled in the art of Class D amplifier design will recognize further policies to be followed within the ambit of the present invention. For example, the invention may well be applied mutatis mutandis to pulse density modulation amplifiers. Furthermore it may well be possible in the third state of operation of the above first SE embodiment of a Class-D amplifier according to the invention to accept a certain common mode distortion and disconnect the reference capacitor Cref from the reference terminal REF.

The invention is embodied in each new characteristic and each combination of characteristics. Any reference signs do not limit the scope of the claims. The word "comprising" does not exclude the presence of other elements than those listed in a claim. Use of the word "a" or "an" preceding an element does not exclude the presence of a plurality of such elements.

The invention claimed is:

1. A three level Class D amplifier comprising
    a control circuit configured to receive an analog input signal and derive therefrom first, second and third PWM switching control signals being supplied to respectively first, second and third switches of a driver to obtain a three level PWM single ended output signal between an output terminal and a reference terminal,
    the first and second switches being serially arranged between first and second supply voltages, one of which providing a common ground coupled to the reference terminal,
    a common node of the first and second switches being coupled to the output terminal through a reference capacitor,
    said third switch being included in a shunt path between the output terminal and the reference terminal,
    a first level of said three level PWM output signal being obtained in said first state of operation in which the first switch is closed and the second and third switches are open,
    a second level thereof being obtained in said second state of operation in which said second switch is closed and said first and third switches are open, and
    an intermediate level thereof at least substantially equal to the reference voltage is being obtained in a third state of operation in which said third switch is closed and said first and second switches are open,
    said reference capacitor being configured to integrate signal voltage variations received from said common node in the first and second states of operation into a DC reference voltage including a DC component at least substantially equidistant between the first and second supply voltages.

2. A three level Class D amplifier comprising
    a control circuit configured to receive an analog input signal and derive therefrom first, second and third PWM switching control signals being supplied to respectively first, second and third switches of a driver to obtain a three level PWM single ended output signal between an output terminal and a reference terminal,
    the first and second switches being serially arranged between first and second supply voltages, one of which providing a common ground coupled to the reference terminal through a reference capacitor, a common node of the first and second switches being coupled to the output terminal, said third switch being included in a shunt path between the output terminal and the reference terminal, a first level of said three level PWM output signal being obtained in said first state of operation in which the first switch is closed and the second and third switches are open, a second level thereof being obtained in said second state of operation in which said second switch is closed and said first and third switches are open, and an intermediate level thereof at least substantially equal to the reference voltage is being obtained in a third state of operation in which said third switch is closed and said first and second switches are open, said reference capacitor being configured to integrate signal voltage variations received from said common node in the first and second states of operation into a DC reference voltage including a DC component at least substantially equidistant between the first and second supply voltages.

\* \* \* \* \*